United States Patent [19]

Rountree et al.

[11] Patent Number: 5,548,225

[45] Date of Patent: Aug. 20, 1996

[54] BLOCK SPECIFIC SPARE CIRCUIT

[75] Inventors: Robert N. Rountree; Dan Cline, both of Plano, Tex.; Darryl G. Walker, Sugar Land, Tex.; Francis Hii, Toa Payoh, Singapore; David W. Bergman, Bedford, Tex.

[73] Assignee: Texas Instruments Incorportated, Dallas, Tex.

[21] Appl. No.: 249,499

[22] Filed: May 26, 1994

[51] Int. Cl.⁶ .................................................. H03K 19/003
[52] U.S. Cl. ........................... 326/13; 326/50; 326/10; 327/525; 365/200
[58] Field of Search ................................ 326/10, 13, 37, 326/113, 49–50, 105, 108; 365/200; 327/525

[56] References Cited

U.S. PATENT DOCUMENTS

| | | | |
|---|---|---|---|
| 4,862,417 | 8/1989 | List et al. | 365/200 |
| 4,881,202 | 11/1989 | Tsujimoto et al. | 365/200 |
| 5,208,776 | 5/1993 | Nasu et al. | 365/200 |
| 5,257,229 | 10/1993 | McClure et al. | 326/13 |
| 5,270,976 | 12/1993 | Tran | 326/10 |
| 5,311,472 | 5/1994 | Ota | 365/200 |

*Primary Examiner*—Edward P. Westin
*Assistant Examiner*—Jon Santamauro
*Attorney, Agent, or Firm*—Robert N. Rountree; Richard B. Havill; Richard L. Donaldson

[57] ABSTRACT

A circuit for selecting a block spare in a semiconductor device is designed with a programmable circuit (14), storing an internal address and producing an address match signal $\overline{AM}$ and a block select signal $\overline{BS}$ in response to first (A) and second (B) address signals and the internal address. A global spare circuit (28) produces a global spare select signal (GSS), in response to the address match signal. A block spare circuit (34) produces a block spare select signal (BSS), in response to the global spare select signal and the block select signal.

14 Claims, 5 Drawing Sheets

BLOCK SPECIFIC SPARE CIRCUIT

FIELD OF THE INVENTION

This invention relates to integrated circuits and more particularly to spare circuits.

BACKGROUND OF THE INVENTION

Present complementary metal oxide semiconductor (CMOS) dynamic random access memory (DRAM) circuits are frequently used for main memory in a variety of applications including desk top and portable computer systems. The extensive demand for dynamic random access memory circuits requires an optimal balance between minimum feature sizes and the inherent defect density of the process in order to maximize yield. The trend in dynamic random access memory design is to improve yield beyond that afforded by minimal defect density. This is accomplished by the addition of spare elements that may be programmed to replace defective array elements and thereby improve yield.

Memory circuits are often divided into partitions or blocks that may be activated individually or as a group of blocks to conserve power or facilitate parallel test. Speed limitations and complexity compromised the effectiveness of previous spare circuits designed for operation with partitioned memory circuits. This imposed a speed penalty on the entire memory circuit, because its access time was characterized by the slowest element. In, U.S. Pat. No. 5,208,776, entitled PULSE GENERATION CIRCUIT, Nasu et al disclose a spare circuit in FIGS. 12–19 for operation with a memory circuit having four partitions. Fuse programable circuits, storing an internal address (FIG. 14), apply either true or complementary external address signals to one of twelve first-stage NOR decoders (FIG. 15) in response to the state of each fuse. The output of each first-stage NOR decoder is routed to each of four second-stage NOR decoders (FIG. 18), corresponding to the four quadrants or blocks. The output of the second-stage NOR decoder enables the spare element (FIG. 19) and disables the normal element (FIG. 12).

There are numerous complex features in the spare circuit disclosed by Nasu. Twelve first-stage decoder outputs must be buffered and routed to each of the four remote second-stage decoders. Each second-stage decoder requires one fuse for each first-stage decoder. Fuses of every second-stage decoder corresponding to a first-stage decoder must be blown except where replacement is desired. These complexities quickly become impractical with an increasing number of first-stage decoders and blocks. For example, for twenty-four first-stage decoders and eight blocks, the circuit disclosed by Nasu would require routing twenty-four first-stage decoder outputs to each of the eight blocks and programing a fuse in seven second-stage decoders for each single-block repair. Additionally, the speed penalty of buffering and series-connected NOR decoders limits the effectiveness of the memory circuit.

SUMMARY OF THE INVENTION

A programmable circuit is designed with a first memory element, arranged for storing a bit. A second memory element is arranged for storing a first signal, the first signal having a first and a second logic state. A logic circuit is responsive to the bit, the first signal and a second signal, for producing an output signal. The output signal has a third and a fourth logic state, responsive to the first logic state, and only the third logic state, responsive to the second logic state.

The present invention produces an output signal that may be used by an address match circuit to replace a first portion, a second portion or both portions of a defective array element. This greatly increases the flexibility of a spare decoder.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1:
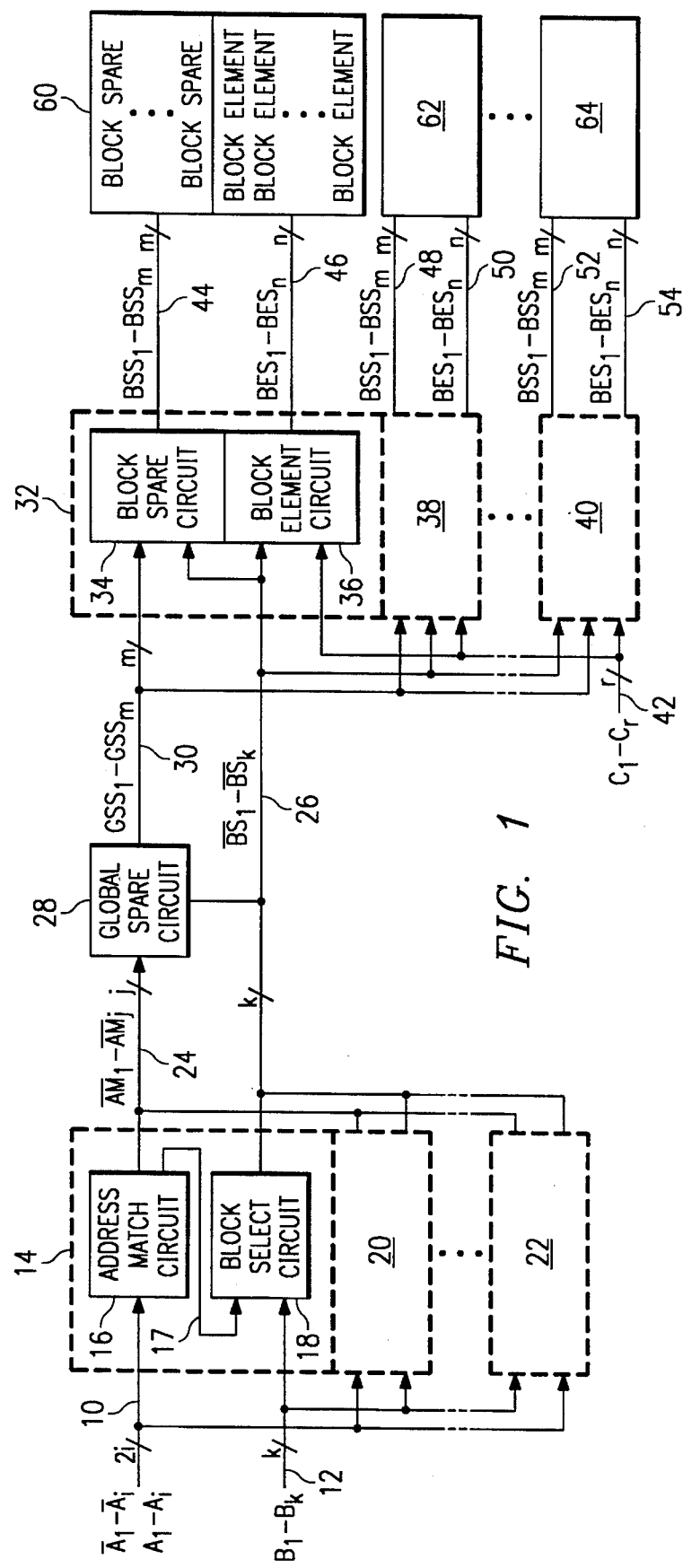
FIG. 1 is a block diagram of an embodiment of the present invention.

Referring now to FIG. 1, there is a group of programable circuits 14, 20–22, each having an address match circuit 16 and a block select circuit 18. A first group of address signals $A_j\text{-}A_i$ and $\overline{A_j}\text{-}\overline{A_i}$ is an input to each address match circuit 16, where subscript i has an integer value, for example ten. An address match circuit, for example address match circuit 16, produces an address match signal $\overline{AM}_1$ and an enable signal $\overline{EN}$ on lead 17 when address signals $A_j\text{-}A_i$ and $\overline{A_j}\text{-}\overline{A_i}$ match a predetermined internal address stored in the address match circuit. The internal address is typically determined by laser programing a group of fuses to correspond to the address of a defective block element. The internal address may be stored as the state of polysilicon fuses, metal fuses, or any other nonvolatile memory elements.

A second group of address signals $B_j\text{-}B_k$ is an input to each block select circuit 18 of programable circuits 14, 20–22, where subscript k has an integer value, for example four. A block select circuit, for example block select circuit 18, produces a block select signal $\overline{BS}_l$ when address signals $B_j\text{-}B_k$ match a predetermined internal address stored in the block select circuit 18 for selecting one of N block spare circuits, for example block spare circuit 34. Preferably, k is equal to N and there are k block select signals corresponding to N blocks 60, 62–64 or memory arrays, respectively, where k and N are integers. Thus, the block select circuit produces a single block select signal, for example block select signal $\overline{BS}_l$, for selecting one of N block spare circuits 34. Alternatively, the block select circuit may be configured to produce $\log_2(N)$ block select signals $\overline{BS}_j\text{-}\overline{BS}_k$, for selecting one of N block spare circuits 34.

Global spare circuit 28 receives address match signals $\overline{AM_1}$–$\overline{AM_j}$ as inputs to produce global spare select signals $GSS_1$–$GSS_m$. Each global spare select signal is a logical function of the first group of address signals. Preferably, subscript j is an integer having a value equal to the number, for example twelve, of programmable circuits 14, 20–22. Preferably, subscript m is an integer having a value equal to the number, for example four, of spare elements coupled to each block specific circuit 32, 38–40. In the global spare circuit 28, several, for example three, address match signals, $\overline{AM_1}$–$\overline{AM_3}$, are mapped into each global spare select signal, such as the signal $GSS_1$. When, any one of the address match signals $\overline{AM_1}$–$\overline{AM_3}$ is active, the global spare circuit 28 will produce an active global spare select signal $GSS_1$.

Block specific circuits 32, 38–40 receive global spare select signals $GSS_1$–$GSS_m$, block select signals $\overline{BS_1}$–$\overline{BS_k}$, and a third group of address signals $C_1$–$C_r$ as inputs. Preferably, address signals $C_1$–$C_r$ are a logical function of address signals $A_1$–$A_i$ for addressing a block element. For example, address signals $C_1$–$C_r$ may be minterms or maxterms of binary address signals $A_1$–$A_i$. Each block specific circuit, for example block specific circuit 32, has at least one block spare circuit 34 and one block element circuit 36. Each block select signal, for example $\overline{BS_1}$, may correspond directly to one or more block specific circuits, for example block specific circuit 32.

Each block spare circuit, for example block spare circuit 34, produces a separate set of block spare select signals $BSS_1$–$BSS_m$ in response to global spare select signals $GSS_1$–$GSS_m$ and block select signals $\overline{BS_1}$–$\overline{BS_k}$. Each set of block spare select signals $BSS_1$–$BSS_m$ is coupled to a block of memory cells, for example block 60, having block spares and block elements. Each block spare select signal is a logical function of the first group of address signals. An active block spare select signal, for example $BSS_1$, will enable at least one block spare to replace a block element in the respective block 60. The block spare may be a redundant row or column element in the block 60 of memory cells.

Each block element circuit, for example block element circuit 36, produces a separate set of block element select signals $BES_1$–$BES_n$ in response to block select signals $\overline{BS_1}$–$\overline{BS_k}$ and a third group of address signals $C_1$–$C_r$. Each block element select signal is a logical function of the third group of address signals for selecting a block element. Preferably, subscript n is an integer having a value equal to the number, for example four, of a subset of block element select signals required for block element decoding. Preferably, subscript r is an integer having a value at least equal to the number, for example two, of address signals required to produce the subset of block element select signals. An active block element select signal, for example $BES_1$, will select at least one block element in the respective block 60 when no replacement is necessary. The block element may be a row or column element in a block of memory cells.

Figure 2:
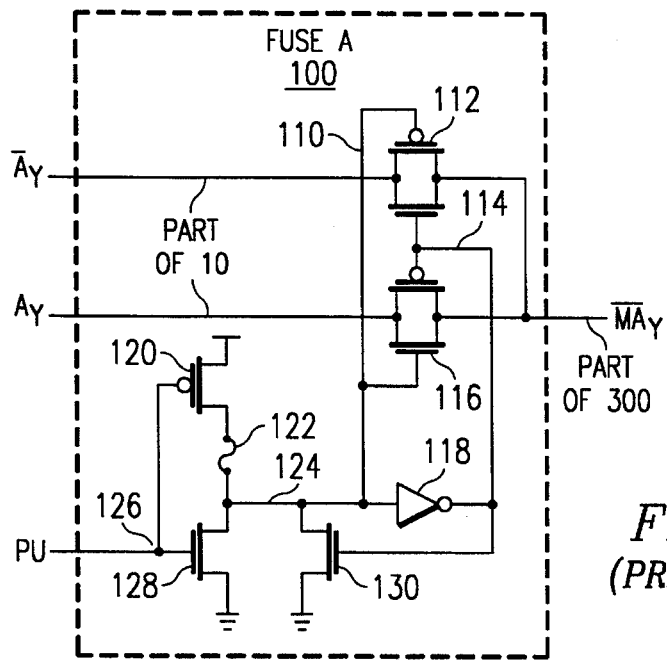
FIG. 2 is a fuse circuit of prior art which may be used in the address match circuit 16 in FIG. 1.

Referring now to FIG. 2, there is a type A fuse circuit 100, as disclosed by Nasu et al, which may be included in address match circuit 16. The type A fuse circuit 100 of FIG. 2 may be used for either row or column components of address signals $A_1$–$A_i$ and $\overline{A_1}$–$\overline{A_i}$. Fuse 122 is programmed to a predetermined internal address, preferably by a pulse of laser energy sufficient to melt a portion of the fuse. The type A fuse circuit 100 produces memory address signal $\overline{MA_y}$ from true address signal $A_y$ or complementary address signal $\overline{A_y}$ when the fuse is either intact or blown, respectively, where subscript y is an integer having a value from 1 to i.

Figure 3:
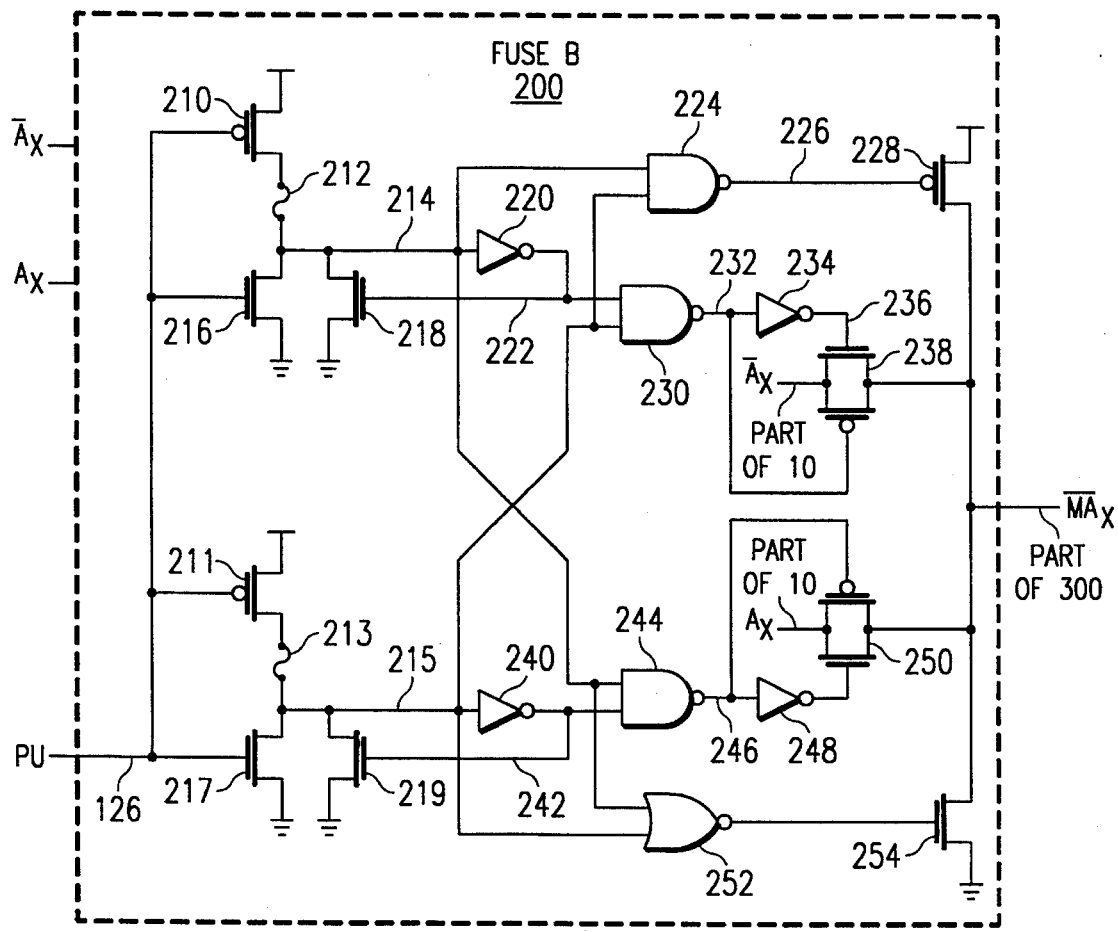
FIG. 3 is another fuse circuit which may be used in the address match circuit 16 in FIG. 1.
Figure 4:
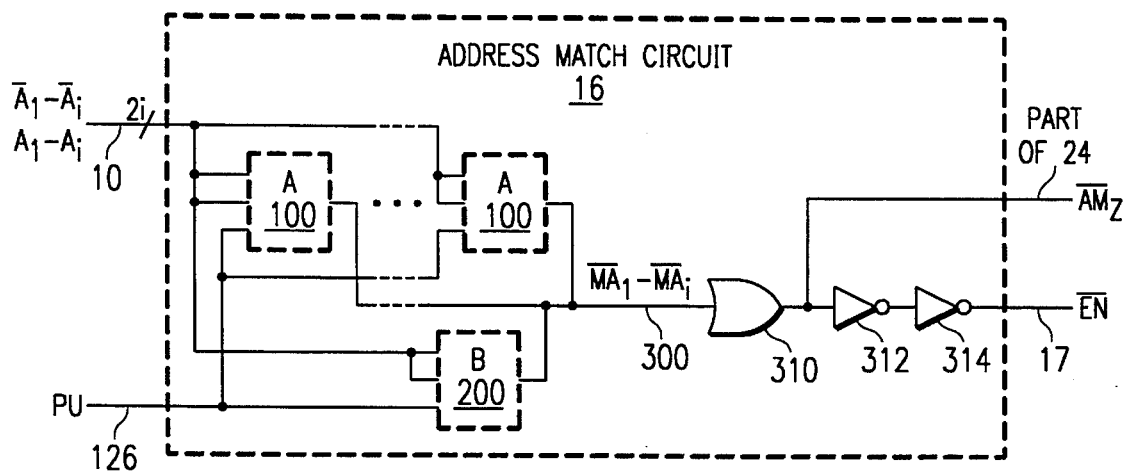
FIG. 4 is an address match circuit which may be used in the block diagram of FIG. 1.

Referring now to FIG. 3, there is a type B fuse circuit 200, that may be used for either row or column components of address signals to produce memory address signal $\overline{MS_x}$ from address signals $A_x$ and $\overline{A_x}$, where subscript x is an integer having a value from 1 to i. Additionally, the type B fuse circuit 200 enables the OR decoder 310 in FIG. 4. Fuses 212 and 213 are programmed to a predetermined internal address. During power up, a short positive power up pulse PU on a lead 126 is produced by a circuit as disclosed in FIG. 123 of U.S. Pat. No. 5,208,776. Power up pulse PU sets the latches formed by inverter 220 and transistor 218 and inverter 240 and transistor 219. If the fuses 212 and 213 remain intact when the pulse PU goes high, nodes 214 and 215 are both high. The output of NAND gate 224 is low, and p-channel transistor 228 is on. The output of NOR gate 252 is low, and n-channel transistor 254 is off. Thus, memory address signal $\overline{MA_x}$ is driven to a high reference level and the OR decoder 310 of FIG. 4 is disabled. If the fuse 212 is blown and fuse 213 remains intact when the pulse PU goes high, nodes 214 and 215 are low and high, respectively. Different input states at NAND gate 224 and NOR gate 252 produce high and low outputs, respectively, thereby turning off p-channel 228 and n-channel transistor 254. Both inputs of NAND gate 230 are high, producing a low output at node 232, thereby turning on pass gate 238. Both inputs of NAND gate 244 are low, producing a high output at node 246, thereby turning off pass gate 250. Thus, memory address signal $\overline{MA_x}$, equivalent to address signal $\overline{A_x}$, is applied to the OR decoder 310 of FIG. 4.

If the fuse 213 is blown and fuse 212 remains intact when the pulse PU goes high, outputs of NAND gate 224 and NOR gate 252 again produce high and low outputs, respectively, thereby turning off p-channel 228 and n-channel transistor 254. However, output states of NAND gates 230 and 244 are reversed, thereby turning off pass gate 238 and turning on pass gate 250. Thus, memory address signal $\overline{MA_x}$, equivalent to address signal $A_x$, is applied to the OR decoder 310 of FIG. 4.

Referring now to FIG. 4, there is an address match circuit 16 which may be used in programmable circuit 14 of FIG. 1. The address match circuit 16 includes several type A fuse circuits, a type B fuse circuit, and an OR decoder circuit 310. An internal address is programmed in the type A and B fuse circuits so that it corresponds to the address of at least a portion of a defective block element. For example, if the defective block element is a portion of a column of memory cells in a block 60 (FIG. 1), fuse circuits 100 (FIG. 4) having column address signal inputs are programmed to the column address of the defective block element. Fuse circuits 100 having row address signal inputs are programmed to include the row addresses of the memory cells in the block element. This is highly advantageous, because a single block spare may be used to replace defective portions of several block elements.

During power up, a short positive power up pulse PU sets the latches of each fuse circuit 100 and 200. Address signals $A_1$–$A_i$ and $\overline{A_1}$–$\overline{A_i}$, which may comprise row and column address signals, are applied to the fuse circuits 100 and 200 to produce memory address signals $\overline{MA_1}$–$\overline{MA_i}$, respectively. Memory address signals $\overline{MA_1}$–$\overline{MA_i}$ are applied as inputs to the OR decoder 310. If any of memory address signals $\overline{MA_1}$–$\overline{MA_i}$ is high, address match signal $\overline{AM_z}$ at the output of OR gate 310 and enable signal $\overline{EN}$ are high. Here, subscript z is an integer having a value from 1 to j. When all memory address signals $\overline{MA_1}$–$\overline{MA_i}$ are low, an address match ims indicated, and address match signal $\overline{AM_z}$ at the output of OR gate 310 and enable signal $\overline{EN}$ are low. Enable signal $\overline{EN}$ is logically equivalent to address match signal $\overline{AM_z}$, so the address match signal could also be used for an enable signal. However, inverters 312 and 314 are desirable to produce equivalent gate delays through signal paths of block select circuit 18 (FIG. 5) and global spare circuit 28 (FIG. 6).

Figure 5:
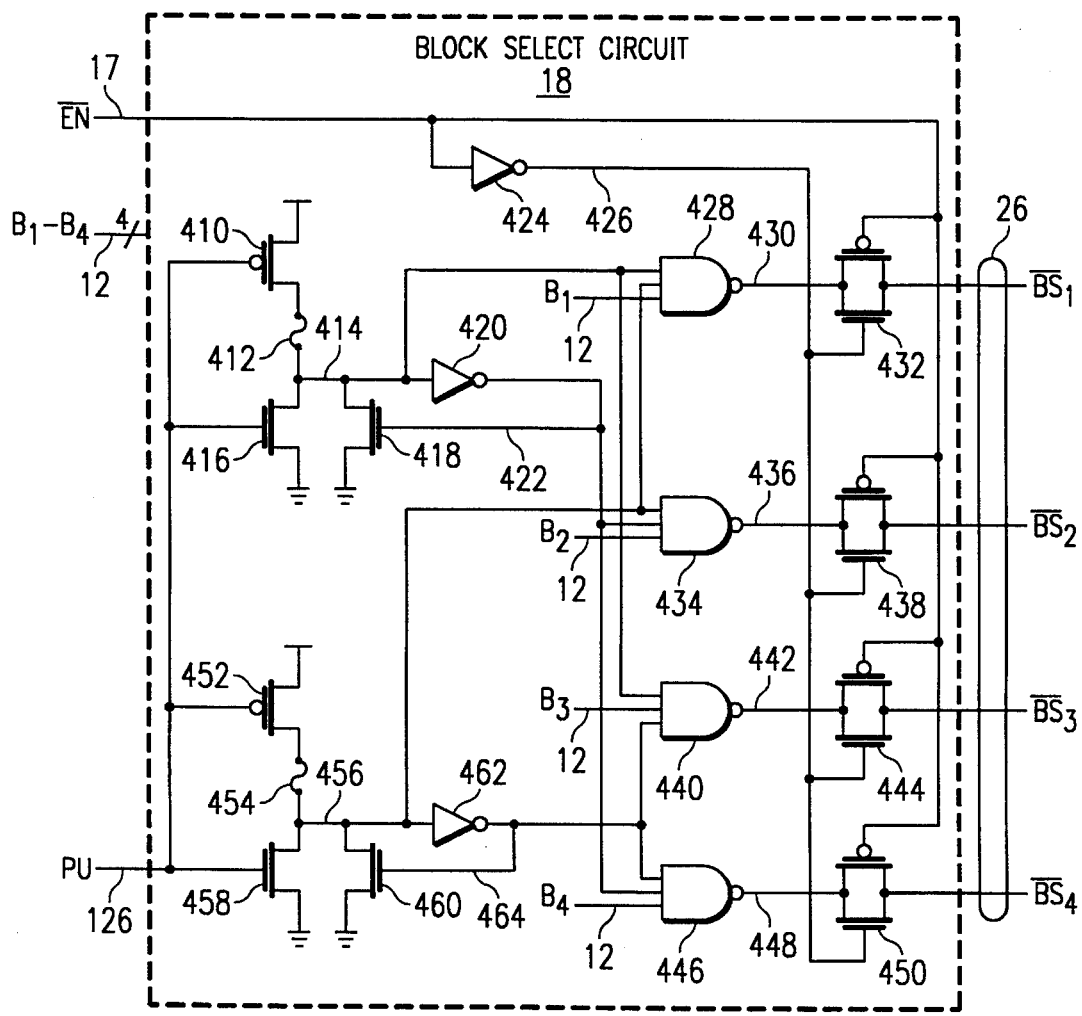
FIG. 5 is a block select circuit which may be used in the block diagram in FIG. 1.
Figure 6:
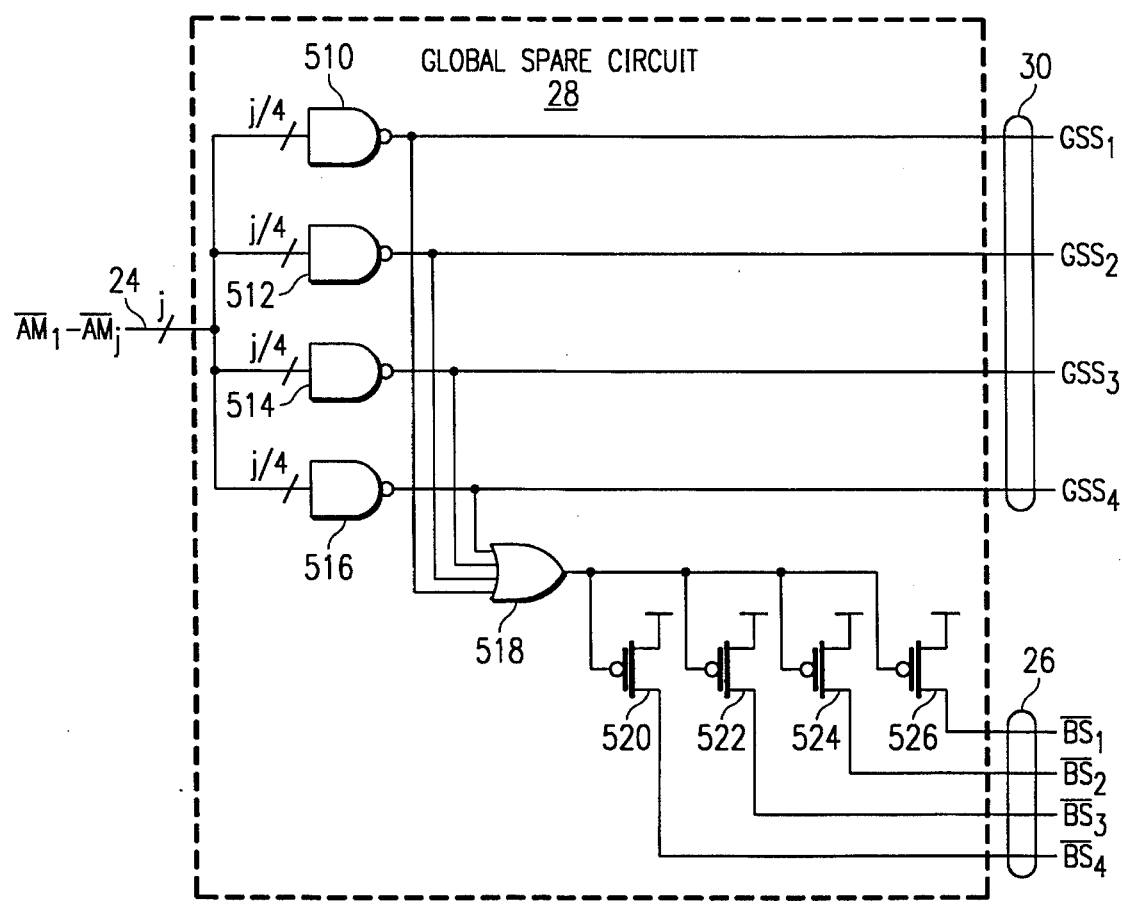
FIG. 6 is a global spare circuit which may be used in the block diagram in FIG. 1.

Referring now to FIG. 5, a block select circuit 18 which may be used in programmable circuit 14 of FIG. 1 will be described in detail. The block select circuit 18 has two fuse circuits. Fuses 412 and 454 of the fuse circuits are programmed to a predetermined internal address, representing a two-bit block address. During power up, power up pulse PU on the lead 126 sets the latches formed by inverter 420 and transistor 418 and inverter 462 and transistor 460. True and complementary outputs of each fuse circuit are connected to NAND gates 428, 434, 440 and 446 to select one of the four NAND gates for each predetermined internal address. For example, if fuses 412 and 454 remain intact when the PU pulse goes high, fuse circuit outputs at terminals 414 and 456 are high and enable only NAND gate 428.

During normal circuit operation, when only one block is active and three are inactive, one address signal, for example $B_1$, is high and the other three address signals $B_2$–$B_4$ are low. Address signal $B_1$ is applied to an input of NAND gate 428 via bus 12. If NAND gate 428 is already selected by the predetermined internal address from the fuse circuits, the output of NAND gate 428 goes low. Outputs of NAND gates 434, 440 and 446, however, remain high. If address match circuit 16 (FIG. 4) detects a match and produces an active low enable signal $\overline{EN}$ at terminal 17 (FIG. 5), CMOS pass gates 432, 438, 444 and 450 are enabled, thereby coupling the NAND gate outputs to bus 26. Block select signal $\overline{BS}_1$ is driven low and block select signals $\overline{BS}_2$–$\overline{BS}_4$ remain high, thereby selecting a block designated by address signals $B_1$–$B_4$ and the predetermined internal address for replacement of a block element. Alternatively, if no address match is detected, enable signal $\overline{EN}$ remains high, CMOS pass gates 432, 438, 444 and 450 are not enabled, block select signals $\overline{BS}_1$–$\overline{BS}_4$ remain high, and no block element is replaced.

During parallel test, when, for example, all four blocks are active, address signals $B_1$–$B_4$ are all high. However, only the output of NAND gate 428, selected by the predetermined internal address, will go low. Outputs of NAND gates 434, 440 and 446 remain high, and the block select circuit functions as in normal operation.

A significant advantage of the block select circuit is a reduction in fuse programming required for block selection. The circuit disclosed by Nasu et al required programming one fuse in each second-stage decoder where a repair was not desired. Thus, three fuses were blown to select one of four blocks for replacement of a defective block element. Alternatively, seven fuses would be blown to select one of eight blocks. The instant invention uses two fuses to store an internal address of one of four blocks. Thus, an average of one fuse is blown to select one of four blocks for replacement of a defective block element. Alternatively, three fuses are required to address eight blocks, so an average of only 1.5 fuses are blown to select one of eight blocks. Thus, block selection is three times as efficient with four blocks and nearly five times as efficient with eight blocks.

Another significant advantage of the block select circuit is a reduction in the total number of fuses required for block selection. The circuit disclosed by Nasu et al required one fuse in each second-stage decoder for each first-stage decoder. Thus, for twenty-four first-stage decoders and eight blocks, one hundred ninety-two fuses would be required for block selection. In the instant invention, a comparable configuration would only require seventy-two fuses. Thus, a significant reduction in layout area is realized.

Referring now to FIG. 6, there is a global spare circuit 28, responsive to address match signals $\overline{AM}_i$–$\overline{AM}_j$, for producing a global spare select signal, for example signal $GSS_1$. Address match signals $\overline{AM}_i$–$\overline{AM}_j$ from programmable circuits 14, 20–22 (FIG. 1) are applied to the input terminals of NAND gates 510, 512, 514 and 516 via bus 24 (FIG. 6). One fourth of the address match signals are mapped into each of the global spare select signals $GSS_1$–$GSS_4$. For example, if there are twelve programmable circuits 14, 20–22, three are connected to inputs of each NAND gate, e.g., NAND gate 510. When all address match signals $\overline{AM}_i$–$\overline{AM}_j$ are high, global spare select signals $GSS_1$–$GSS_4$ at bus 30 are low, and no block element will be replaced. Consequently, the output of OR gate 518 is low, thereby turning on p-channel transistors 520, 522, 524 and 526 and driving block select signals $\overline{BS}_1$–$\overline{BS}_4$ high.

When one of address match signals $\overline{AM}_i$–$\overline{AM}_j$ goes low, the output of the corresponding NAND gate goes high, producing, for example, an active high global spare select signal $GSS_1$ and low global spare select signals $GSS_2$–$GSS_4$. Consequently, the output of OR gate 518 goes high, thereby turning off p-channel transistors 520, 522, 524 and 526. Block select signals $\overline{BS}_1$–$\overline{BS}_4$, are then driven to the appropriate state by the enabled block select circuit, as discussed previously.

The global spare circuit 28 holds block select signals $\overline{BS}_l$–$\overline{BS}_k$ high when there is no active address match signal $\overline{AM}_i$–$\overline{AM}_j$ and block select circuit 18 outputs from programmable circuits 14, 20–22 (FIG. 1) are in a high impedance state, thereby perpetually enabling block elements when no repair is required. Thus, there is no speed penalty for address matching when there is no repair. When repair is required, the global spare circuit 28 releases block select signals $\overline{BS}_1$–$\overline{BS}_4$ which are then driven by an active block select circuit 18 of one of programmable circuits 14, 20–22. Thus, the block select signal bus 26 is driven by the global spare circuit 28 for selecting a block element circuit 36, or it is driven by a block select circuit, for example block select circuit 18, for selecting a block spare circuit, for example block spare circuit 34.

A significant advantage of the global spare circuit 28 is a reduction in the total signal line routing required for spare element selection. The circuit disclosed by Nasu et al required routing each first-stage decoder output to every block. For twelve first-stage decoders, for example, twelve signals were routed to each of four blocks. In the instant invention, twelve address match signals would be routed to a single, nearby global spare circuit. Preferably, four global spare select signals are then routed to each block.

Figure 7:
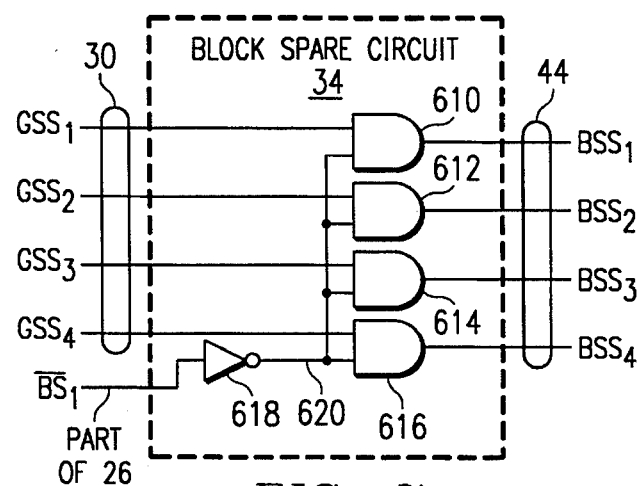
FIG. 7 is a block spare circuit which may be used in the block diagram in FIG. 1.

Referring now to FIG. 7, there is a block spare circuit 34, responsive to a global spare select signal and a block select signal, for producing a block spare select signal, thereby selecting a block spare. Each of the global spare select signals $GSS_1$–$GSS_4$ on bus 30 is applied separately to one input of each AND gate 610, 612, 614 and 616, respectively. One of block select signals $\overline{BS}_l$–$\overline{BS}_k$, for example $\overline{BS}_l$, is inverted by inverter 618 and coupled to the other input of each AND gate 610, 612, 614 and 616. When an address match is detected for a specific block, one of block select signals $\overline{BS}_l$–$\overline{BS}_k$, for example $\overline{BS}_l$, goes low. Inverter 618 drives common input terminal 620 of the AND gates 610, 612, 614 and 616 high, thereby selecting block spare circuit 34. One of global spare select signals $GSS_1$–$GSS_4$, for example $GSS_1$, goes high in response to the address match, thereby enabling AND gate 610 and producing a high level block spare select signal $BSS_1$. Block spare select signals $BSS_2$–$BSS_4$ remain low. Block spare select signal $BSS_1$ is coupled to enable a block spare which replaces a defective block element.

Figure 8:
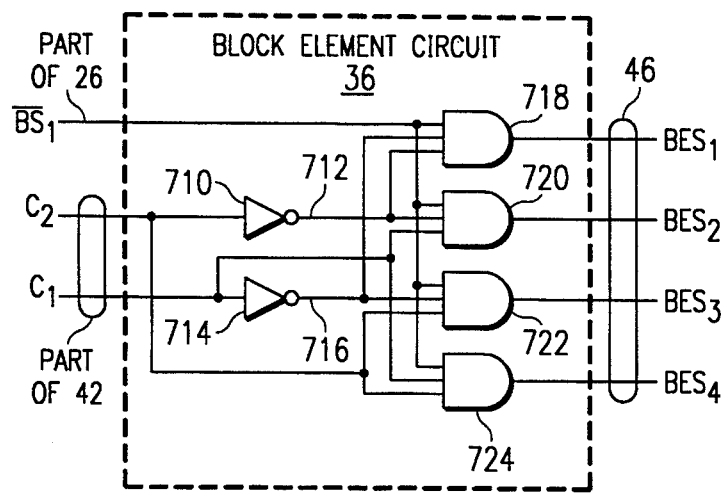
FIG. 8 is a block element select circuit which may be used in the block diagram in FIG. 1.

Referring now to FIG. 8, there is a block element circuit 36, responsive to a block select signal $\overline{BS}_1$ and a third group of address signals $C_1$–$C_2$, for producing a block element select signal, thereby selecting a block element. One of block select signals $\overline{BS}_1$–$\overline{BS}_k$, for example $\overline{BS}_1$, is connected to one input of each of AND gates 718, 720, 722 and 724. Address signals $C_1$–$C_2$ are applied to block specific circuits 32, 38–40 via bus 42 (FIG. 1), where address signals $C_1$–$C_2$ are a subset of address signals $C_1$–$C_r$. Address signals $C_1$–$C_2$ (FIG. 8) are inverted by inverters 714 and 710, respectively. The resulting true and complementary signals are connected to other inputs of AND gates 718, 720, 722 and 724 in a binary sequence. When no address match is detected for a specific block, block select signal $\overline{BS}_1$, for example, remains high, and one of the AND gates 718, 720, 722 and 724 is enabled by address signals $C_1$–$C_2$. Each block element select signal, for example $BES_1$, is coupled to enable a block element. However, when an address match is detected for the block, block select signal $\overline{BS}_1$ goes low, thereby deselecting block element circuit 36. Block element select signals $BES_1$–$BES_4$ remain low, and the defective block element is disabled.

Although the invention has been described in detail with reference to its preferred embodiment, it is to be understood that this description is by way of example only and is not to be construed in a limiting sense.

Figure 9:
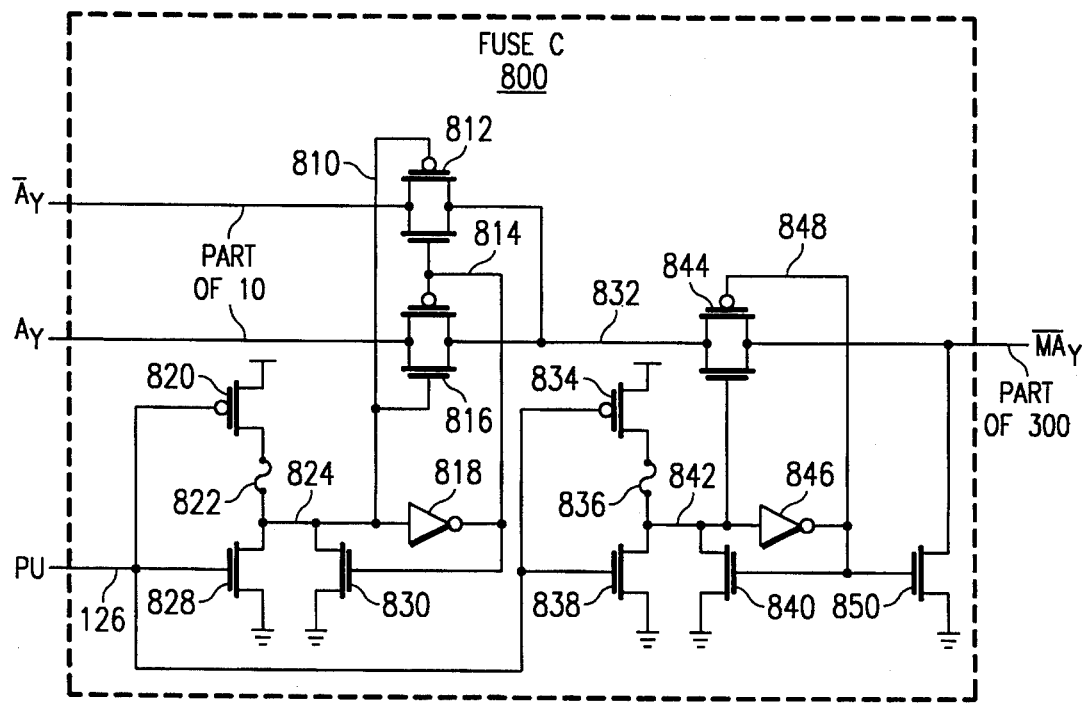
FIG. 9 is another fuse circuit which may be used in the address match circuit 16 in FIG. 1.

For example, in FIG. 9, there is a type C fuse circuit 800 which may be substituted for one or more of the type A fuse circuits (FIG. 2) in another embodiment of address match circuit 16. Elements 812–830 function in the same manner as elements 112–130 of the type A fuse circuit 100 of FIG. 2. Fuse 822 is programmed to a predetermined internal address, so that the signal at terminal 832 is equivalent to true address signal $A_y$ or complementary address signal $\overline{A}_y$ when the fuse 822 is either intact or blown, respectively. Fuse 836 is also programmed to a predetermined logic state. The latch formed by inverter 846 and transistor 840 is set by power up pulse PU, so that the control signal at terminal 842 is high if the fuse 836 is intact and low if the fuse 836 is blown. When fuse 836 remains intact, CMOS pass gate 844 is on, and memory address signal $\overline{MA}_y$ is equivalent to the signal at terminal 832. Thus, when fuse 836 remains intact, the type C fuse circuit 800 functions in the same manner as the type A fuse circuit 100 (FIG. 2). Other embodiments of the type C fuse circuit 800 produce equivalent results. For example, an AND gate having a first input connected to terminal 832 and a second input connected to terminal 842 may be substituted for CMOS pass gate 844 and transistor 850 to produce memory address signal $\overline{MA}_y$.

When fuse 836 is blown, the latch formed by inverter 846 and transistor 840 holds the signal at terminal 842 low, and CMOS pass gate 844 is off. The resulting high output of inverter 846 at terminal 848 turns on n-channel transistor 850, thereby driving memory address signal $\overline{MA}_y$ to a low reference level. Thus, when fuse 836 is blown, the type C fuse circuit 800 produces a low output, and perpetually indicates a match for either state of address signal $A_y$.

Each type C fuse circuit 800 may be programmed to indicate a match condition between the internal address stored by fuse 822 and either true address signal $A_y$, complementary address signal $\overline{A}_y$, or both. Thus, a defective block element may be replaced at an address indicated by a true address signal, a complementary address signal, or both with a single fuse circuit.

For example, if a defective block element is a portion of a column of memory cells in a block 60 (FIG. 1), eight type A fuse circuits 100 (FIG. 2) having column address signal inputs are programmed to the column address of one of two hundred fifty-six columns of memory cells in the block 60 (FIG. 1). Two type C fuse circuits 800 (FIG. 9) having row address signal inputs are programmed to include the row addresses of the memory cells. These two fuse circuits 800 having row address signal inputs are programmed to replace one fourth, one half, or the entire column of memory cells in the block 60 (FIG. 1) with a single address match circuit 16 as in FIG. 4. Thus, eight type A fuse circuits are programmed to match the address of a defective column or block element, and two type C fuse circuits are programmed to match a row address of a portion of the defective column or block element. This is highly advantageous, because many isolated defects, such as single memory cells, may be replaced by portions of a single block spare. Cumulative defects, such as a defective column of memory cells, may be replaced with a single address match circuit 16.

In another embodiment, AND gates 718, 720, 722 and 724 (FIG. 8) may be permanently enabled by alternatively connecting the block select signal $\overline{BS}_1$ input to a positive supply. An address match signal then produces a block element select signal and a block spare select signal, and data is produced by the defective block element and the block spare. However, only data from the block spare is routed to the output, as disclosed by Nasu et al (FIG. 54).

In yet another embodiment, block select signals $\overline{BS}_1$–$\overline{BS}_k$ are binary address signals for selecting one of N block spare circuits, such as block spare circuit 34 (FIG. 1), where k is equal to $\log_2(N)$. For example, two block select signals may select one of four (or two of eight) block specific circuits, where two is equal to $\log_2(4)$. Enable signal $\overline{EN}$ 17 (FIG. 4) and block select signals $\overline{BS}_1$–$\overline{BS}_k$ (FIG. 5) are selectively connected by a CMOS pass gate or other tristate driver to a common bus. The tristate driver is enabled by an address match signal, for example $\overline{AM}_z$ (FIG. 4). The common bus is routed to each block specific circuit, for selecting a block spare.

In yet another embodiment, the CMOS pass gates 432, 438, 444 and 450 (FIG. 5) may be replaced with tristate bus drivers, such as disclosed in U.S. Patent application Ser. No. 855,958, when additional drive is required for block select lines. The static OR decoder 310 of the address match circuit 16 (FIG. 4) may be replaced with an AND decoder or a variety of precharge-discharge decoders, as disclosed by Nasu et al (FIG. 15). It is to be understood that OR and AND decoders with inverted outputs are equivalent to NOR and NAND decoders, respectively. It is to be further understood that numerous changes in the details of the embodiments of the invention will be apparent to persons of ordinary skill in the art having reference to this description. It is contemplated that the embodiments described together with such changes are within the spirit and true scope of the invention, as claimed below.

What is claimed is:

1. A programmable circuit for producing an address match signal in a semiconductor device, the circuit comprising:

a plurality of first memory circuits, arranged for storing a first internal address, responsive to a first group of address signals and the first internal address, for producing a plurality of first memory address signals;

a second memory circuit, arranged for storing a second internal address, responsive to a second address signal and the second internal address, for producing a second memory address signal;

a third memory circuit, for producing a control signal having a first and a second logic state;

a first logic circuit, responsive to the second memory address signal and the first logic state of the control signal, for producing a third memory address signal having a third logic state when the second address signal matches the second internal address and producing, responsive to the second logic state, the third memory address signal having only the third logic state; and a second logic circuit, responsive to the plurality of first memory address signals and the third memory address signal, for producing an address match signal.

2. A programmable circuit, as in claim 1, wherein the first logic circuit, responsive to the first logic state of the control signal, couples the second memory address signal to the third memory address signal and, responsive to the second logic state of the control signal, couples a reference level to the third memory address signal.

3. A programmable circuit, as in claim 2, wherein the first internal address comprises at least part of an address of a defective array element, the defective array element having at least one defective portion.

4. A programmable circuit as in claim 3, wherein the second interval address comprises at least part of an address of the at least one defective portion.

5. A programmable circuit as in claim 4, wherein the first group of address signals are column address signals and the second address signal is a row address signal.

6. A programmable circuit as in claim 4, wherein the first group of address signals are row address signals and the second address signal is a column address signal.

7. A programmable circuit comprising:

a first memory element, arranged for storing a datum;

a second memory element, arranged for storing a first signal, the first signal having a first and a second logic state; and a logic circuit, responsive to the datum, the first logic state and a second signal, for producing an output signal having a third logic state when the datum matches the second signal, the logic circuit, responsive to the second logic state, producing the output signal having only the third logic state.

8. A programmable circuit as in claim 7, wherein the datum is an address bit of an array element.

9. A programmable circuit as in claim 8, wherein the first signal is a control signal.

10. A programmable circuit as in claim 9, wherein the second signal is an address signal, the address signal having the first and second logic states.

11. A programmable circuit as in claim 10, wherein the output signal is coupled to the address signal, responsive to the first logic state of the control signal, and the output signal is coupled to a reference voltage, responsive to the second logic state of the control signal.

12. A programmable circuit as in claim 7, wherein the second signal comprises a third and a fourth signal, the third and fourth signals being complementary address signals.

13. A programmable circuit as in claim 12, wherein the logic circuit couples one of the third and fourth signals to a memory address signal, responsive to the datum.

14. A programmable circuit as in claim 13, wherein the logic circuit couples the second signal to the output signal, responsive to the first logic state, and couples a reference voltage to the output signal, responsive to the second logic state.

* * * * *